United States Patent

Quercia et al.

(10) Patent No.: US 10,897,822 B2
(45) Date of Patent: Jan. 19, 2021

(54) ELECTRONIC DEVICE COMPRISING AN ELECTRONIC COMPONENT MOUNTED ON A SUPPORT SUBSTRATE AND ASSEMBLY METHOD

(71) Applicant: STMicroelectronics (Grenoble 2) SAS, Grenoble (FR)

(72) Inventors: Fabien Quercia, Isere (FR); David Auchere, Meylan (FR); Norbert Chevrier, Lumbin (FR); Fabien Corsat, Cessieu (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/815,554

(22) Filed: Mar. 11, 2020

(65) Prior Publication Data
US 2020/0305283 A1    Sep. 24, 2020

(30) Foreign Application Priority Data

Mar. 19, 2019    (FR) ...................... 19 02793

(51) Int. Cl.
*H05K 1/18* (2006.01)
*H05K 3/34* (2006.01)

(52) U.S. Cl.
CPC .......... *H05K 1/181* (2013.01); *H05K 3/3431* (2013.01); *H05K 3/3468* (2013.01); *H05K 2201/10734* (2013.01); *H05K 2201/10977* (2013.01); *H05K 2203/041* (2013.01); *H05K 2203/049* (2013.01); *H05K 2203/0475* (2013.01)

(58) Field of Classification Search
CPC .............. H05K 1/181; H05K 3/3468; H05K 2201/10977; H05K 2201/10984; H05K 2201/10992; H05K 2203/04–041
See application file for complete search history.

(56) References Cited

U.S. PATENT DOCUMENTS

| 5,551,627 A | 9/1996 | Leicht et al. | |
| 6,027,791 A * | 2/2000 | Higashi | H05K 3/3436 257/693 |
| 2004/0070082 A1* | 4/2004 | Sundahl | H05K 3/4614 257/778 |

(Continued)

OTHER PUBLICATIONS

INPI Search Report and Written Opinion for FR 1902793 dated Nov. 15, 2019 (8 pages).

*Primary Examiner* — Hoa C Nguyen
(74) *Attorney, Agent, or Firm* — Crowe & Dunlevy

(57) ABSTRACT

A support substrate has first electric contacts in a front face. An electronic component is located above the front face of the support substrate and has second electric contacts facing the first electric contacts of the support substrate. An electric connection structure is interposed between corresponding first and second electric contacts of the support substrate and the electronic component, respectively. Each electric connection structure is formed by: a shim that is made of a first electrically conducting material, and a coating that is made of a second electrically conducting material (different from the first electrically conducting material). The coating surrounds the shim and is in contact with the corresponding first and second electric contacts of the support substrate and the electronic component.

14 Claims, 1 Drawing Sheet

(56) References Cited

U.S. PATENT DOCUMENTS

| | | | |
|---|---|---|---|
| 2009/0130838 A1* | 5/2009 | Sakaguchi | H01L 24/13 |
| | | | 438/613 |
| 2009/0236725 A1 | 9/2009 | Hirano et al. | |
| 2012/0326200 A1* | 12/2012 | Shen | H01L 33/62 |
| | | | 257/99 |
| 2014/0146503 A1* | 5/2014 | Chino | H01L 23/49816 |
| | | | 361/767 |
| 2014/0328039 A1 | 11/2014 | Koep et al. | |

* cited by examiner

ELECTRONIC DEVICE COMPRISING AN ELECTRONIC COMPONENT MOUNTED ON A SUPPORT SUBSTRATE AND ASSEMBLY METHOD

PRIORITY CLAIM

This application claims the priority benefit of French Application for Patent No. 1902793, filed on Mar. 19, 2019, the content of which is hereby incorporated by reference in its entirety to the maximum extent allowable by law.

TECHNICAL FIELD

The present invention relates to the field of electronic devices that comprise electronic components mounted on support substrates.

BACKGROUND

Currently, according to the standard technology for surface mount components (referred to as surface mount technology—SMT), electronic components are mounted on support substrates by means of compressed solder spots that generally spread and extend beyond the edges of the electronic components. This creates a problem due to the fact that such solder spots occupy large surface area, which requires, in order to avoid short-circuits, placing the connection spots of an electronic component at significant distances and placing neighboring electronic components on the same support substrate at significant distances.

SUMMARY

According to one embodiment, an electronic device is proposed that comprises a support substrate having electric contacts in a front face, an electronic component located above the front face of the support substrate and having electric contacts facing the electric contacts of the support substrate, and an electric connection structure respectively interposed between the electric contacts of the support substrate and the electric contacts of the electronic component.

Each electric connection structure comprises a shim, made of an electrically conducting material, and a coating, made of an electrically conducting material, which surrounds the shim and which is in contact on the corresponding electric contacts of the support substrate and of the electronic component.

Thus, the coating can be contained around the shim, without spreading.

Advantageously, the coating can adhere to each shim.

Advantageously, the shim can adhere to each electric contacts of the support substrate.

The shims can be made of at least one metal material.

The coating can comprise a hardened brazing material.

The shims can have a melting temperature higher than the melting temperature of the coatings.

A method is also proposed for assembling an electronic component with electric contacts above a support substrate with electric contacts.

The method comprises the following steps: providing electric contacts of the support substrate with shims made of an electrically conducting material; depositing droplets of brazing paste made of an electrically conducting material above the shims, so as to coat the shims; placing the electronic component above the shims, so that the electric contacts of the electric component are above the shims and so that the droplets of brazing paste are in contact with the corresponding electric contacts of the support substrate and of the electronic component; and hardening the droplets of brazing paste so as to produce electric connection coatings, surrounding the shims, between the corresponding electric contacts of the support substrate and of the electronic component.

The shims can be formed by end portions of a wire, which portions are soldered onto the electric contacts of the support substrate and are left by isolating the wire.

BRIEF DESCRIPTION OF THE DRAWINGS

An electronic device will now be described by way of a non-limiting embodiment, illustrated by the accompanying drawings, in which.

DETAILED DESCRIPTION

Figure 1:
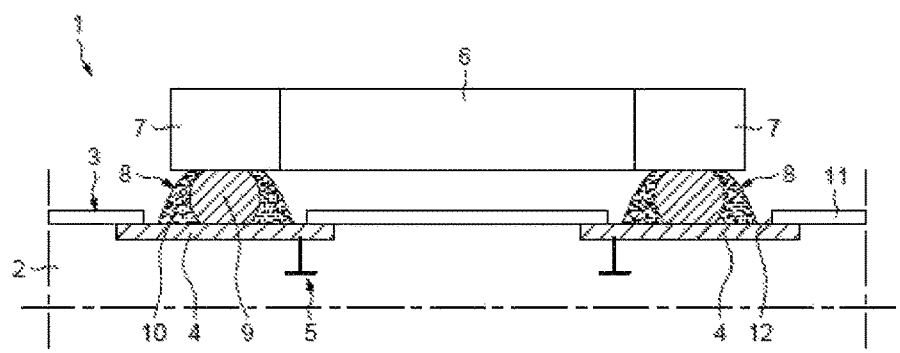
FIG. 1 shows a section view of an electronic device.

FIG. 1 shows an electronic device 1 which comprises a support substrate 2 provided, in a front face 3, with local remote electric contacts 4 of an integrated network of electric connections 5. The device 1 further comprises an electronic component 6 placed above and at a distance from the front face 3 and which is provided with local electric contacts 7 respectively located facing the electric contacts 4. For example, the electric contacts 7 are adjacent to opposite ends of the electronic component 6.

The electronic device 1 comprises an electric connection structure 8 interposed between the electric contact 4 of the support substrate 2 and the corresponding electric contact 7 of the electronic component 6.

Each electric connection structure 8 comprises a shim 9, made of an electrically conducting material, and a coating 10, made of an electrically conducting material, which surrounds the shim 9 and which is in contact on the corresponding electric contacts 4 and 7 of the support substrate 2 and of the electronic component 6.

Thus, an electric current can circulate between the electric contacts 4 and 7 through both the shim 9 and the coating 10.

Advantageously, the electric connection structure 8 has at least some of the following features.

The coatings 10 adhere to the shims 9.

The shims 9 adhere to the electric contacts 4 of the support substrate.

The shims 9 are made of a metal material, for example, of copper.

The coatings 10 comprise a hardened brazing material.

The electric contacts 7 of the electronic component 6 rest above the shims 9.

The shims 9 have a melting temperature higher than the melting temperature of the coatings 10.

Optionally, the support substrate 2 comprises an outer dielectric layer 11 provided with openings 12 above the electric contacts 4, the electric connection structure being above exposed parts of the electric contacts 4.

The coatings can be at a distance from or in contact with edges of the openings 12.

The electronic device 1 can be mounted as follows.

The support substrate 2, provided with local electric contacts 4 and optionally with the dielectric layer 11, is made available.

Figure 2:
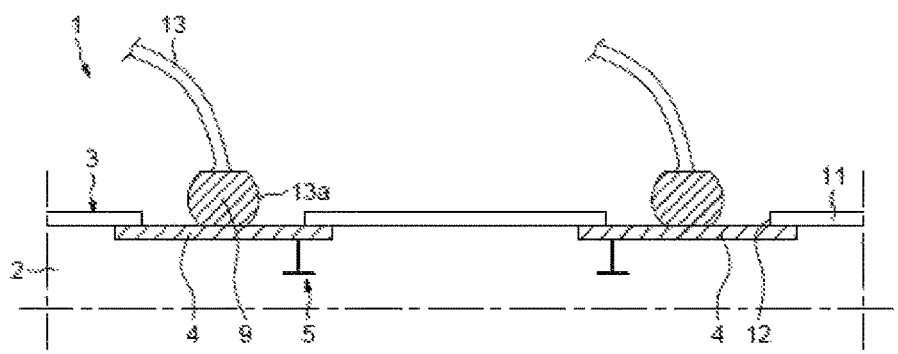
FIGS. 2, 3 and 4 show the successive steps of manufacturing the electronic device of FIG. 1.

As shown in FIG. 2, shims 9 made of an electrically conducting material are fixed on the electric contacts 4.

Advantageously, the shims 9 are formed by end portions 13a of a wire 13, formed in the form of balls, which are slightly compressed and soldered onto the electric contacts 4 of the support substrate 2 and are left by isolating (i.e., cutting) the wire as close as possible to the formed balls.

Thus, the shims 9 can be produced on a wire bonding machine specifically implemented to produce electric connections through wires of electronic chips, additionally with isolation of the wire.

Figure 3:
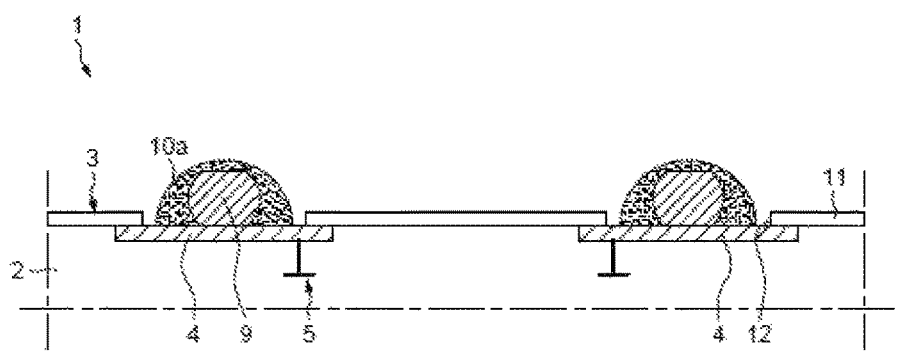

Subsequently, as shown in FIG. 3, droplets of brazing paste 10a are deposited, which paste includes an electrically conducting material, above the produced shims 9, so as to coat the shims 9, with the droplets of brazing paste 10a coming into contact on the electric contacts 4 of the support substrate 2. This operation is performed, for example, using a controlled flow rate syringe.

Advantageously, the droplets of brazing paste 10a are retained against the surface of the shims 9 through the effect of wetting and of adhesion, so that the droplets of brazing paste 10a remain located above and around the shims 9, which form a means of retention.

Figure 4:
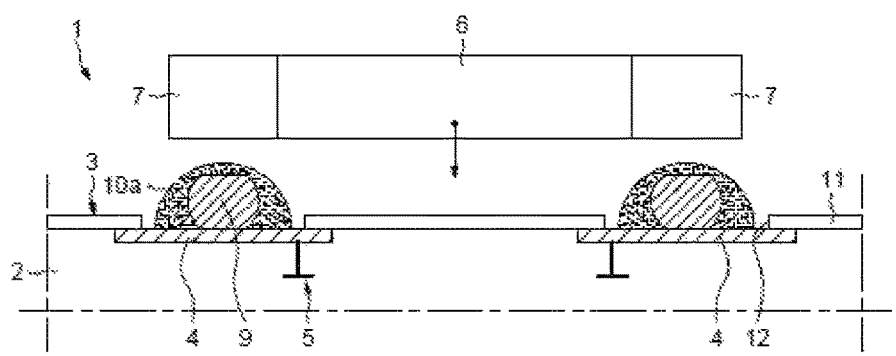

Subsequently, as shown in FIG. 4, using a controlled handling and positioning tool (such as a pick and place machine), the electronic component 6 is placed above the shims 9, so that the electric contacts 7 of the electric component 6 are above the shims 9, advantageously in abutment therewith, and bear against the droplets of brazing paste 10a so that said droplets are in contact with the corresponding electric contacts 4 and 7 of the support substrate 2 and of the electronic component 6.

Here again, the droplets of brazing paste 10a are retained against the peripheral surface of the shims 9 and against the electric contacts 4 and 7, around the shims 9, through the effect of wetting and of adhesion.

Part of the droplets of brazing paste 10a remains between the top of the shims 9 and the electric contacts 7 of the electronic component 6.

Furthermore, the edges of the openings 12 of the outer layer 11 can form barriers limiting spreading of the droplets of brazing paste 10a.

Subsequently, the droplets of brazing paste 10a are hardened by placing the stacked device in an oven, for example, in order to produce the electric connection coatings 10, surrounding the shims 9, between the corresponding electric contacts 4 and 7 of the support substrate 2 and of the electronic component 6, with the coating also enabling fastening of the electronic component 6 above the support substrate.

Advantageously, the oven temperature is lower than the melting temperature of the shims 9 but higher than the melting temperature of the droplets of brazing paste 4a, so that the shims 9 remain in the solid state.

By virtue of the aforementioned features, the electric connection structure 8 occupy limited surface areas above the surface 3 of the support substrate 2. Thus, the electronic component 6 and the support substrate 2 can be connected by nearby electric connection structure and other electronic components can be mounted above the support substrate at a short distance from the electronic component 6.

The invention claimed is:

1. An electronic device, comprising:
   a support substrate having first electric contacts in a front face;
   an electronic component located above the front face of the support substrate and having second electric contacts facing the first electric contacts of the support substrate; and
   an electric connection structure interposed between corresponding first and second electric contacts of the support substrate and the electronic component, respectively;
   wherein each electric connection structure comprises:
      a shim made of a first electrically conducting material, wherein said shim comprises an end portion of a wire soldered onto the first electric contact of the support substrate; and
      a coating made of a second electrically conducting material, different from the first electrically conducting material, which surrounds the shim and which is in contact with said corresponding first and second electric contacts of the support substrate and of the electronic component, respectively.

2. The device according to claim 1, wherein the coating adheres to the shim.

3. The device according to claim 2, wherein each shim adheres to the first electric contact of the support substrate.

4. The device according to claim 1, wherein each shim adheres to the electric contact of the support substrate.

5. The device according to claim 1, wherein first electrically conducting material of each shim comprises at least one metal material.

6. The device according to claim 5, wherein the at least one metal material is copper.

7. The device according to claim 1, wherein the second electrically conducting material of each coating comprises a hardened brazing material.

8. The device according to claim 1, wherein the first electrically conducting material of each shim has a melting temperature that is higher than a melting temperature of the second electrically conducting material of each coating.

9. A method for assembling an electronic component with second electric contacts above a support substrate with first electric contacts, comprising:
   providing a shim made of a first electrically conducting material at each first electric contact of the support substrate, wherein providing comprises forming each shim from an end portion of a wire that is soldered onto the first electric contact of the support substrate and isolating the end portion from the wire;
   depositing a droplet of brazing paste made of a second electrically conducting material at each shim, wherein the droplet coats the shim;
   placing the electronic component above the shims, so that the second electric contacts of the electric component are above the shims and so that the droplets of brazing paste are in contact with the corresponding first electric contacts of the support substrate and the second electric contacts of the electronic component;
   hardening the droplets of brazing paste so as to produce an electric connection coating which surrounds each shim in a position between the corresponding first and second electric contacts of the support substrate and the electronic component, respectively.

10. The method according to claim 9, wherein said wire is a bonding wire.

11. The method according to claim 9, wherein the first electrically conducting material of each shim comprises at least one metal material.

12. The method according to claim 11, wherein the at least one metal material is copper.

13. The method according to claim 9, wherein the second electrically conducting material comprises a hardened brazing material.

14. The method according to claim 9, wherein the first electrically conducting material has a melting temperature that is higher than a melting temperature of the second electrically conducting material.

\* \* \* \* \*